United States Patent [19]

Bauer

[11] Patent Number: 5,243,201
[45] Date of Patent: Sep. 7, 1993

[54] MOS-CONTROLLED THYRISTOR MCT

[75] Inventor: Friedhelm Bauer, Baden, Switzerland

[73] Assignee: Asea Brown Boveri Ltd., Baden, Switzerland

[21] Appl. No.: 928,023

[22] Filed: Aug. 11, 1992

[30] Foreign Application Priority Data

Aug. 16, 1991 [DE] Fed. Rep. of Germany ....... 4127033

[51] Int. Cl.⁵ ............... H01L 29/74; H01L 29/10; H01L 29/78
[52] U.S. Cl. .................. 257/135; 257/146; 257/328; 257/337; 257/341
[58] Field of Search ............ 357/38, 23.4, 23.11, 357/45, 49; 257/133, 135, 140, 146, 328, 337, 341, 390

[56] References Cited

U.S. PATENT DOCUMENTS 4,646,117  2/1987  Temple ........................... 357/23.4

FOREIGN PATENT DOCUMENTS 0064613  11/1982  European Pat. Off. .
0118007  9/1984  European Pat. Off. .
0139998  5/1985  European Pat. Off. .

OTHER PUBLICATIONS

US-Z: Temple, Victor A. K.: "MOS-Controlled Thyristors-A New Class of Power Devices". IEEE Transactions on Electron Devices, vol. ED-33, No. 10, Oct. 1986, pp. 1609-1618.

US-Z: Bauer, F., et al.: "Current-Handling and Switching Performance of MOS-Controlled Thyristor (MCT) Structures". IEEE Electron Devices Lett. vol. 12, No. 6, Jun. 1991, pp. 297-299.

*Primary Examiner*—Andrew J. James
*Assistant Examiner*—Ngan Van Ngo
*Attorney, Agent, or Firm*—Oblon, Spivak, McClelland, Maier & Neustadt

[57] ABSTRACT

In an MOS-controlled thyristor MCT comprising a multiplicity of adjacently disposed individual MCT cells (MC) having a cell width and which are electrically connected in parallel, either the MCT cells (MC) themselves or cell clusters (15) comprising a few closest-packed MCT cells (MC) are mutually separated by nonemitting gaps (2) which do not inject charge carriers into the cathode base layer and which have lateral linear dimensions greater than or at least equal to the cell width of the MCT cells (MC). As a result of this separation, the full performance of the individual MCT cell (MC) is achieved even in large-area components containing many cells.

14 Claims, 10 Drawing Sheets

MOS-CONTROLLED THYRISTOR MCT

BACKGROUND OF THE INVENTION

1. Field of the Invention

The present invention relates to the field of power electronics. It relates to an MOS-controlled thyristor MCT, comprising (a) a semiconductor substrate having two opposite principal surfaces, one of which is assigned to an anode, and the other is assigned to a cathode and forms a cathode surface;

(b) a layer sequence inside the semiconductor substrate between the anode and the cathode, which layer sequence comprises an emitter layer of a first conductivity type, a first base layer of a second conductivity type opposite to the first, and a second base layer of the first conductivity type;

(c) a multiplicity of adjacently disposed and parallel-connected MCT cells inside the semiconductor substrate between the anode and the cathode;

(d) an emitter region of the second conductivity type embedded in the second base layer inside every MCT cell on the cathode side, connection to which emitter region is made from the cathode surface by means of a cathode contact; and (e) an MOS structure, which forms a switchable short circuit between the second base layer and the cathode contact, inside every MCT cell on the cathode side.

Such an MCT is disclosed, for example, by the paper by V. A. K. Temple in IEEE Trans. Electron Devices, vol. ED-33, pages 1609-1618 (1986).

2. Discussion of Background

In the application in power-electronic circuits, in particular in speed-controlled motor drives, major system simplifications would be feasible if the current control in the power semiconductors used, as it is currently known from the GTO, could be replaced by a voltage control. For lower powers, this change from current to voltage control has already been achieved by replacing the conventional bipolar transistors with the recently developed IGBTs (Insulated Gate Bipolar Transistors).

For higher powers, which essentially remain the province of the thyristors, efforts have been in progress for a fairly long time to replace the GTO in a similar manner by developing the voltage-controlled MCT (MOS-Controlled Thyristor). Hitherto, however, these efforts have not been very successful because large-area MCTs continue to suffer from detrimental inhomogeneous current distributions, in particular during the turn-off phase.

Even for components having cathode areas of only one mm$^2$, this phenomenon reduces the turn-off current densities to very low values of about 50 A/cm$^2$. In contrast to this, for arrangements of only a few cells (a large-area MCT always comprises a multiplicity of individual small MCT cells in which the cathode area is then only about 0.01 mm$^2$) excellent turn-off current densities of several 1000 A/cm$^2$ are observed.

SUMMARY OF THE INVENTION

The object of the invention is therefore to provide an MCT in which the high turn-off current density of the individual MCT cells is substantially retained even in a component having a fairly large cathode area and a multiplicity of MCT cells.

In accordance with a first alternative, the object is achieved in an MCT of the type mentioned at the outset, wherein (f) the individual MCT cells are mutually separated by nonemitting gaps; and (g) the lateral linear dimensions of the nonemitting gaps are at least of the same order of magnitude as the lateral linear dimensions of the individual MCT cell itself.

In accordance with a second alternative, the object is achieved in that (f) all the MCT cells are combined in a plurality of cell clusters;

(g) every cell cluster is formed from a few MCT cells which are disposed in the immediate vicinity of one another;

(h) the cell clusters are mutually separated by nonemitting gaps; and (i) the lateral linear dimensions of the nonemitting gaps are at least of the same order of magnitude as the lateral linear dimensions of the individual MCT cell itself.

In both cases, the essence of the invention is to decouple either the individual MCT cells or small clusters of a plurality of MCT cells from one another by introducing nonemitting gaps to such an extent that the full turn-off capability of the individual cell is retained even when a multiplicity of cells is accommodated in one substrate. In this connection, the internal structure of the individual MCT cell may take different forms.

A first preferred embodiment of the invention is one wherein a reinforced oxide layer is deposited in the gaps on the cathode surface. This embodiment has the advantage of a substantially reduced component input capacitance.

A further embodiment of the invention is one wherein a heavily doped, localized and free-floating separation region of the first conduction type is embedded in the second base layer in the gaps from the cathode surface, which separation region mutually separates the MCT cells or cell clusters. This embodiment has the advantage that any current inhomogeneities which may occur can be smoothed out over the separation region.

Finally, a third preferred embodiment is one wherein (a) DMOS cells are disposed in the gaps;

(b) inside every DMOS cell on the cathode side a channel region of the second conductivity type is embedded in the second base layer and a cathode short-circuit region of the first conductivity type is embedded in the channel region, and connection is made to the cathode short-circuit region from the cathode surface by means of the cathode contact; and (c) an MOS structure is provided inside every DMOS cell on the cathode side, which MOS structure forms a switchable short circuit between the second base layer and the cathode short-circuit region.

In this embodiment, the gaps are advantageously used additionally to extract holes from the interior of the semiconductor substrate by means of the DMOS cells during turn-off and thereby to increase the turn-off capacity further.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Referring now to the drawings, wherein like reference numerals designate identical or corresponding parts throughout the several views, the invention relates to an arrangement of individual elementary MCT cells of an MOS-controlled thyristor MCT inside a common semiconductor substrate. In this connection, every individual MCT cell MC (FIGS. 1A–C) may, for example, have the already known internal structure which is shown in FIG. 1D and which corresponds to a cross section along the line X—X in FIGS. 1A and 1C; in this structure, a layer sequence comprising an emitter layer 12 (p$^+$-doped), a first base layer 11 (n$^-$-doped) and a second base layer 10 (p-doped) is disposed in a semiconductor substrate 3 between an anode A and a cathode K. Embedded from the cathode side in the second base layer 10 is an emitter region 9 (n$^+$-doped), to which connection is made by means of a cathode contact 4 on the cathode surface 1. A corresponding anode contact 13 makes connection to the emitter layer 12 on the anode side.

MOS-controlled short circuits in the form of p-channel MOSFETs which are made up of the second base layer 10, the channel regions 8 (n-doped), the cathode short-circuit regions 7 (p$^+$-doped) and first gate electrodes 6 disposed in an insulated manner above the channel regions 8 (gate insulation 5) are provided on the cathode side for the purpose of turning-off.

The mode of operation of this arrangement is known from the prior art and will therefore not be discussed further here. It may furthermore be pointed out at this point that the structure shown in FIG. 1D is only one of a plurality of possibilities for forming an MCT cell suitable for the invention. Other suitable forms of MCT cells may, for example, have a doping complementary to FIG. 1D, or they may contain an n-channel MOS-FET instead of the p-channel MOSFET for controlling the short circuit.

An MCT designed for fairly high powers comprises a multiplicity of such MCT cells which are adjacently disposed in the semiconductor substrate 3 and are electrically connected in parallel. At the same time, the lateral extension of the individual MCT cells MC may, for example, be square (FIGS. 1A and B) or strip-type (FIG. 1C), hexagonal or of another shape. It is characterized by a cell width a. The distribution of the MCT cells MC on the cathode surface 1 has, as characteristic variable, a cell spacing b which is measured from cell center to cell center between adjacent cells.

Figure 1A:
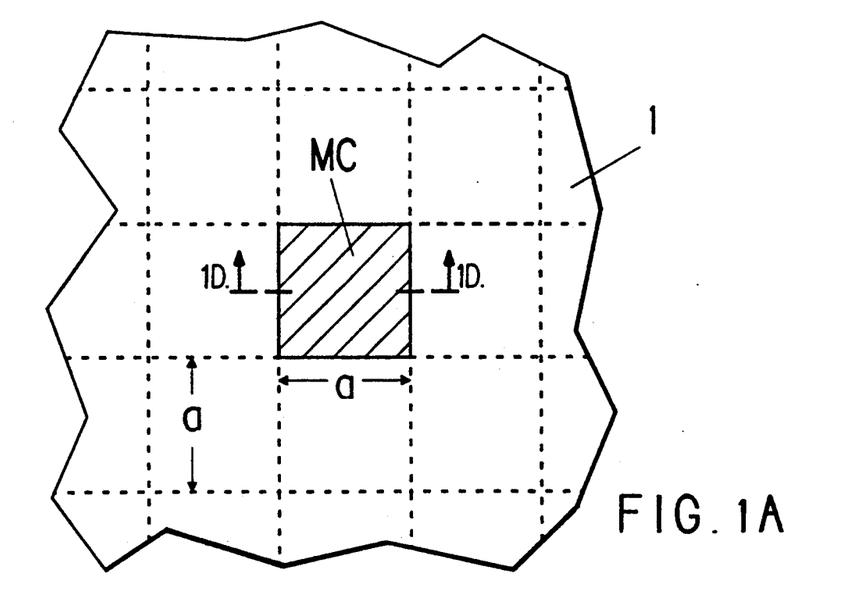
FIG. 1A shows a portion of a basic arrangement of square MCT cells without gap (closest packing) seen from the cathode side.
Figure 1B:
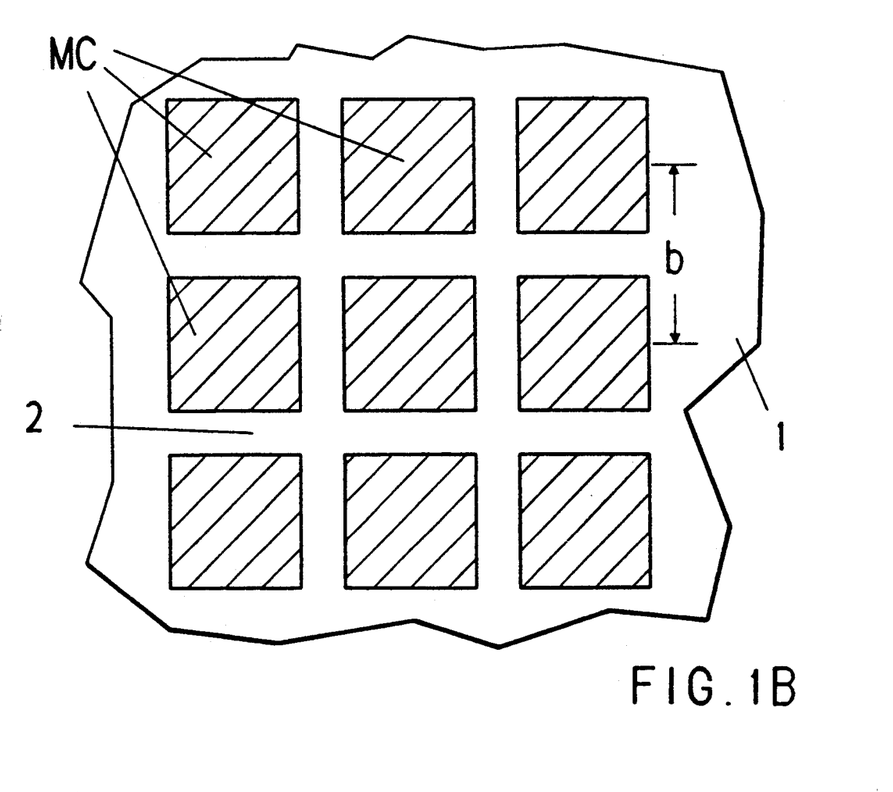
FIG. 1B shows an arrangement, corresponding to FIG. 1A, of MCT cells which are mutually separated by gaps.
Figure 1C:
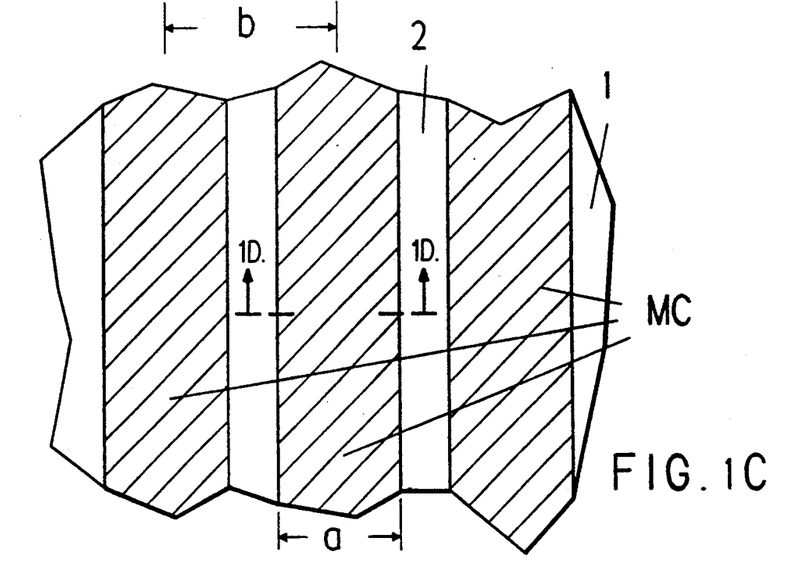
FIG. 1C shows an arrangement, comparable to FIG. 1B, of strip-type MCT cells which are mutually separated by gaps.
Figure 1D:
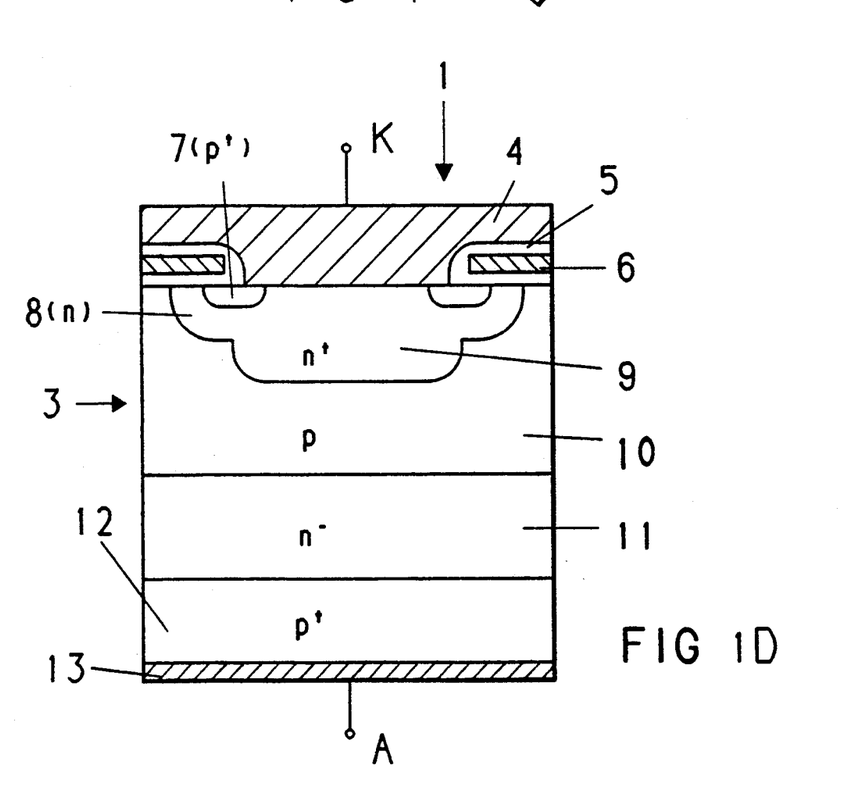
FIG. 1D shows a cross section of a possible internal structure of an MCT cell as encountered in FIGS. 1A–C.

In principle, the starting point is a closest-packed arrangement of MCT cells MC as shown in FIG. 1A for square MCT cells. Cell width a and cell spacing b are in this case equally large. It is, however, also conceivable to mutually separate the individual MCT cells MC by nonemitting gaps 2, as is essential for the invention and is explained in still greater detail in the further course of the description. In that case, the cell spacing b is greater than the cell width a. This then results in the configuration shown in FIG. 1B for square cells and, correspondingly, in the configuration from FIG. 1C for strip-type cells.

Figure 2:
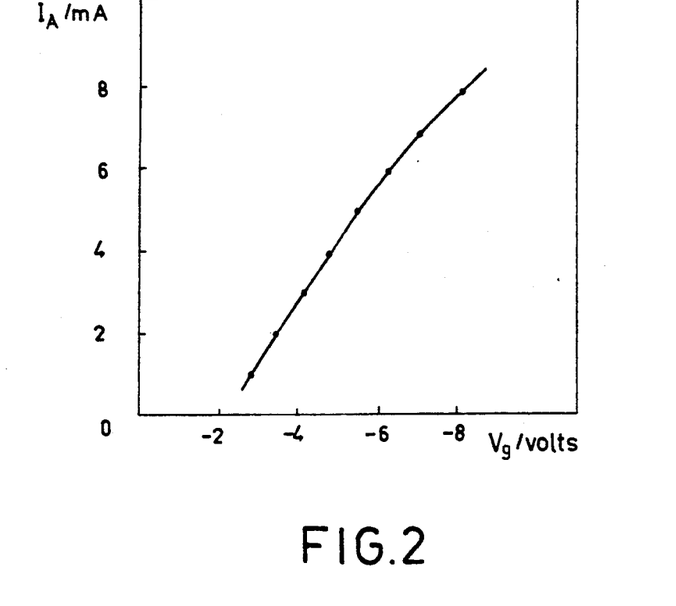
FIG. 2 shows the maximum turn-off current $I_A$ of an individual square MCT cell having an area of $2.25 \times 10^{-4}$ mm$^2$ (edge length: 15 $\mu$m $\times$ 15 $\mu$m) as a function of the gate voltage $V_g$.

To explain the invention, it is first of all important to characterize the size of the MOS-controlled short circuits of an individual MCT cell MC: the magnitude of the anode current $I_A$ which can still be controlled at a specified gate voltage $V_g$ is shown in FIG. 2 for a square MCT cell having the dimensions 15 m×15 μm (cell width a=15 μm). This characteristic curve is very close to a straight line. Its slope may therefore be regarded as a measure of the performance of the MOS-controlled short circuit. In the present case, this numerical value is about 1.2 mA per cell and volt of the gate voltage signal. For a cell having the dimensions 20 μm×20 μm, this results in an experimental value of 1.35 mA per cell and volt. In this connection, the somewhat higher value for the larger cell is attributable to the larger channel width.

Figure 3:
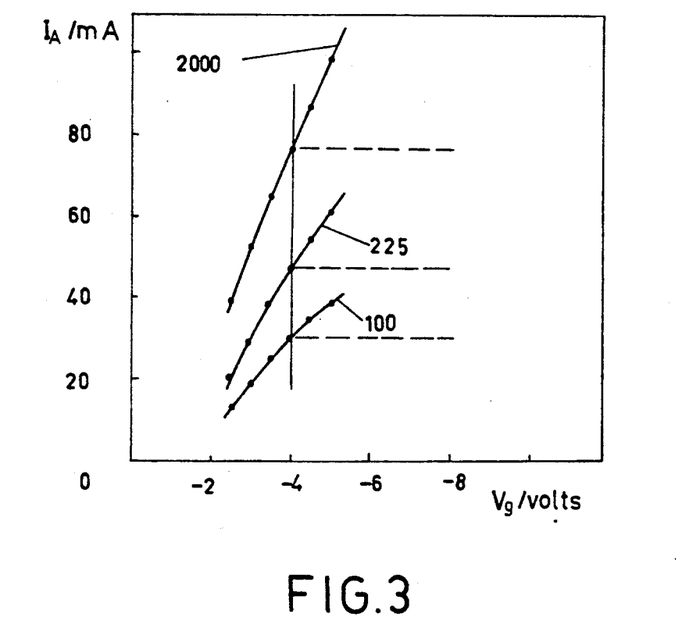
FIG. 3 shows the maximum turn-off current as a function of the gate voltage for closest-packed arrangements of 100, 225 and 2000 similar square MCT cells (edge length of the individual cell: 20 $\mu$m $\times$ 20 $\mu$m)

To produce a high-performance MCT it is therefore important to check whether the controllable anode current $I_A$ increases in proportion to the number of MCT cells if an MCT is constructed which comprises a multiplicity of individual cells. The experimental result of this check is shown in FIG. 3. In this connection, components containing 100, 225 and 2000 cells (dimension of the monocell: 20 μm×20 μm), respectively, have been investigated. The $I_A$ ($V_g$) curves show that even the smallest component (its cell arrangement corresponds to a (10×10) matrix) fails by far to achieve the performance of the monocell. Although the area of the largest component (containing 2000 cells) is twenty times as large as that of the smallest component (containing 100 cells), the controllable anode current increases only by a factor of about 3.

From these results it can be concluded that the performance (this is understood as meaning the anode current which can be controlled by means of the voltage at the MOS gate) does not increase in proportion to the number of cells on the cathode surface but, at best, to the length of the periphery (i.e. in proportion to the square root of the cathode area), that is to say, the performance of a monocell cannot in general be scaled up to larger areas. From this it also becomes clear that, without special measures and precautions, a competitive large-area and high-performance MCT cannot be produced.

The solution of the problem is now provided by two experiments whose results are shown in FIGS. 4 to 7 and which are explained below: in the first experiment, cell arrangements were characterized in relation to the anode current which can be controlled by means of the voltage at the MOS gate. Said arrangements comprised a monocell ((1×1) matrix), and also matrix arrangements of 3×3 cells, 5×5 cells, 7×7 cells, 10×10 cells and, finally, 20×20 cells. At the same time, the same monocell (20 μm×20 μm) was used in all the components (arrangements). All the components were closest-packed cell arrangements in accordance with FIG. 1A.

Figure 4:
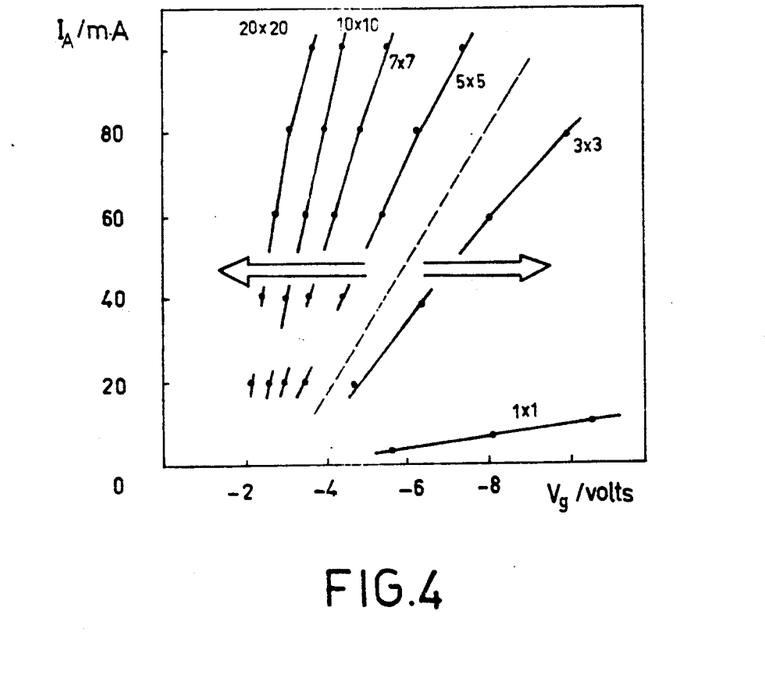
FIG. 4 shows the maximum turn-off current as a function of the gate voltage for closest-packed matrix arrangements of $3 \times 3$, $5 \times 5$, $7 \times 7$, $10 \times 10$ and $20 \times 20$ similar square MCT cells (edge length of the individual cell: 20 $\mu$m $\times$ 20 $\mu$m) compared with the monocell ($1 \times 1$)

The anode currents (normalized for one cell and a gate voltage increment of 1 volt) which can be controlled with these arrangements are shown in FIG. 4. Closer inspection reveals that a linear scaling prevails between the monocell and the (3×3) cell matrix, i.e. nine times the anode current $I_A$ (compared with the monocell) can be controlled with the matrix comprising 9 cells. On the other hand, two-dimensional effects set in in the case of the (5×5) matrix and these have the result that the performance level of the monocell can already no longer be achieved with this structure.

Figure 5:
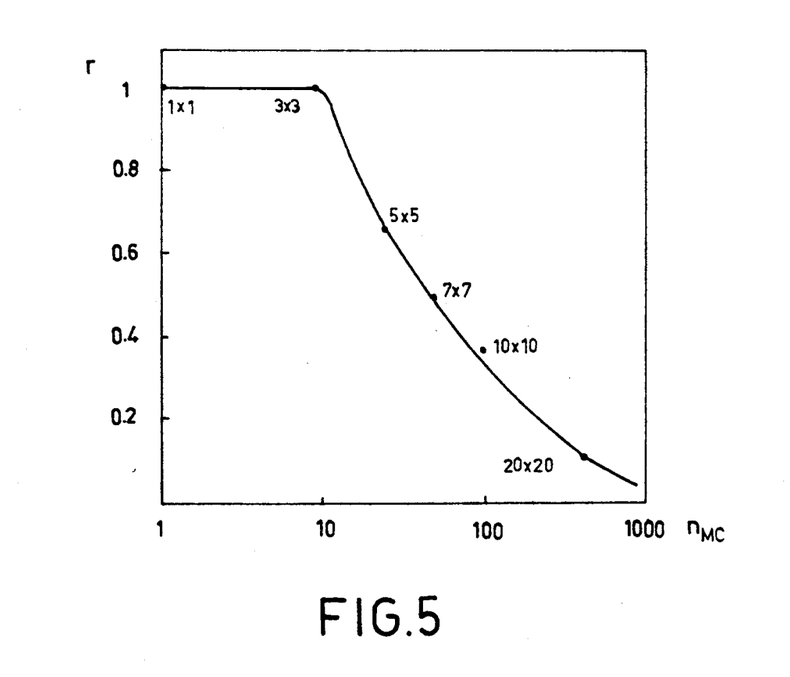
FIG. 5 shows the reduction factor r derived from FIG. 4 (as a measure of the deterioration in the maximum turn-off current per cell for a plurality of closest-packed cells relative to the monocell) as a function of the total number $n_{MC}$ of the MCT cells.

To describe this drop in performance of the cells in the case of arrangements containing larger numbers of cells compared with the monocell, a reduction factor r is introduced and shown in FIG. 5 as a function of the number of cells $n_{MC}$ for the arrangements investigated from FIG. 4. In this connection, the numerical value of r=1 indicates the performance potential of the monocell. In the case of the (5×5) arrangement, an individual cell achieves only 66% (r=0.66) of the turn-off capability of the monocell (assuming a homogeneous current density distribution).

It is evident from FIG. 5 that the reduction in the turn-off capability increases rapidly as the size of the cell matrix increases (increasing $n_{MC}$). It is clear, in turn, that large-area components (a chip area of about 1 cm² is assumed here) having closest packing of the cells are inconceivable without a solution to the scaling problem mentioned.

In the second experiment, the geometrical arrangement of the cells was varied in another way. Starting from the (20×20) matrix already described (size of the monocell: 15 μm×15 μm) with closest packing of the cells, the cell spacing b (15 μm in the case of closest packing) was increased in other arrangements. For comparison, the following arrangements were used: (15×15) matrix with 20 μm cell spacing; (12×12) matrix with 25 μm cell spacing; (10×10) matrix with 30 μm cell spacing; (6×6) matrix with 50 μm cell spacing and, finally, also a (3×3) matrix with 100 μm cell spacing.

Figure 6:
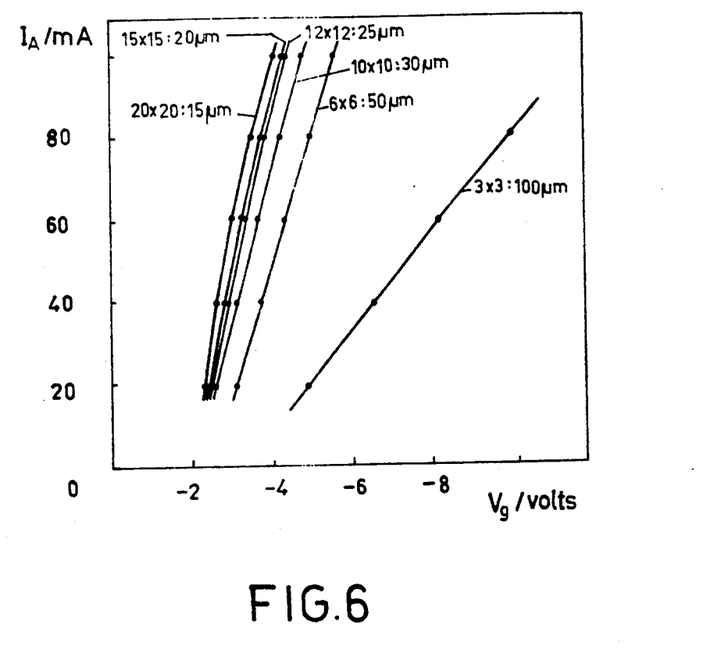
FIG. 6 shows the maximum turn-off current as a function of the gate voltage for matrix arrangements of $3 \times 3$, $6 \times 6$, $10 \times 10$, $12 \times 12$, $15 \times 15$ and $20 \times 20$ similar square MCT cells (edge length of the individual cell: 15 $\mu$m $\times$ 15 $\mu$m) with varying cell spacing b (15 $\mu$m to 100 $\mu$m)

All the structures were again compared with a monocell in relation to their turn-off capability (normalized for one cell and 1 volt gate-voltage increment). FIG. 6 shows (like FIG. 4) the controllable anode current $I_A$ as a function of the gate voltage $V_g$ for the test structures enumerated above. If the reduction factor r is also calculated here (as in FIGS. 4 and 5) and is plotted against the cell spacing b, the curve shown in FIG. 7 is obtained.

Figure 7:
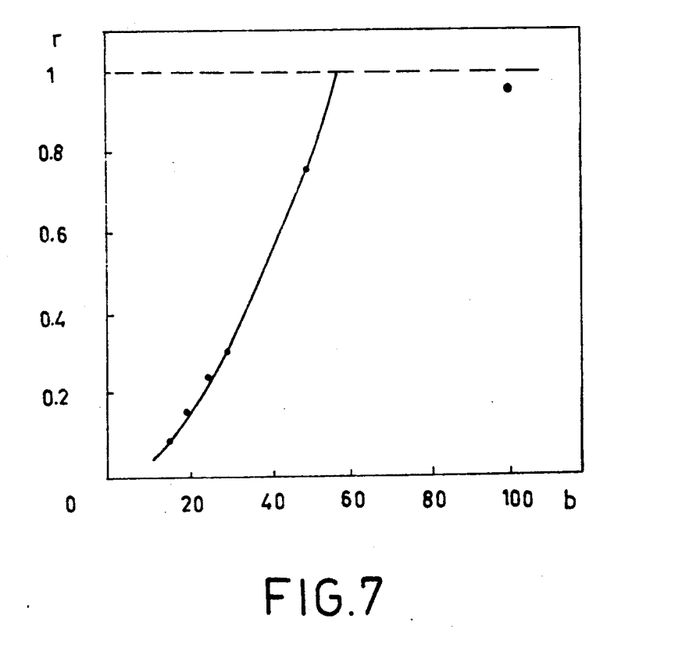
FIG. 7 shows the reduction factor $\tau$ derived from FIG. 6 as a function of the cell spacing b of the individual MCT cells.

A notable feature of the curve shown in FIG. 7 is, in particular, that the cells in an arrangement with cell spacings b of less than 60 to 70 82 m behave like an insulated monocell and apparently are no longer aware of their vicinity. This discovery forms the starting point for the first alternative solution of the present invention: it is wrong to pack the individual MCT cells as closely as possible in the MCT; on the contrary, it is a requirement to maintain a minimum spacing between the cells if it is desired to achieve the maximum turn-off capability even in fairly large arrangements.

Although, as already mentioned above, the experiments described have been carried out on special DMOS-MCT structures, the relevance of the invention for any desired MCT cell structures (that is to say even those of the NMOS type or those of the complementary DMOS type) is established. The same also applies to all the conceivable anode structures such as, for example, anode short circuits, additional barrier layers, or even to the design of the edge termination.

Figure 8A:
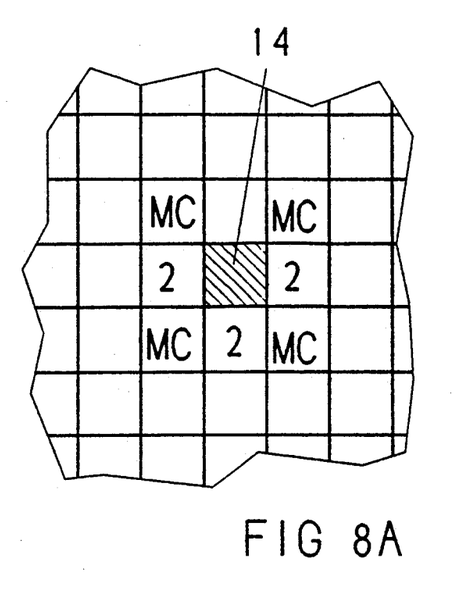
FIGS. 8A, B show arrangements of square or strip-type MCT cells which are separated, in accordance with the invention, by gaps whose linear dimensions are just as large as the linear dimensions of the individual cells.
Figure 8B:
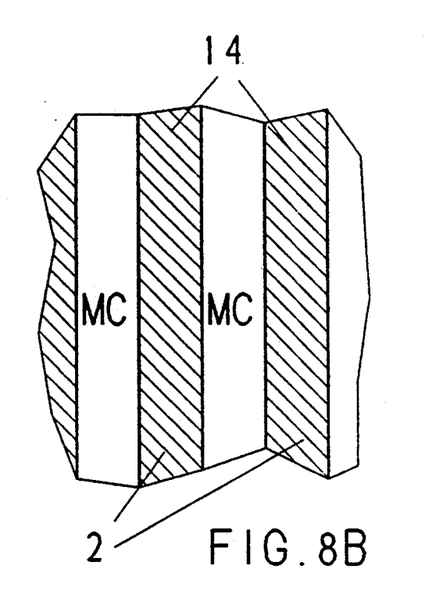
Figure 9:
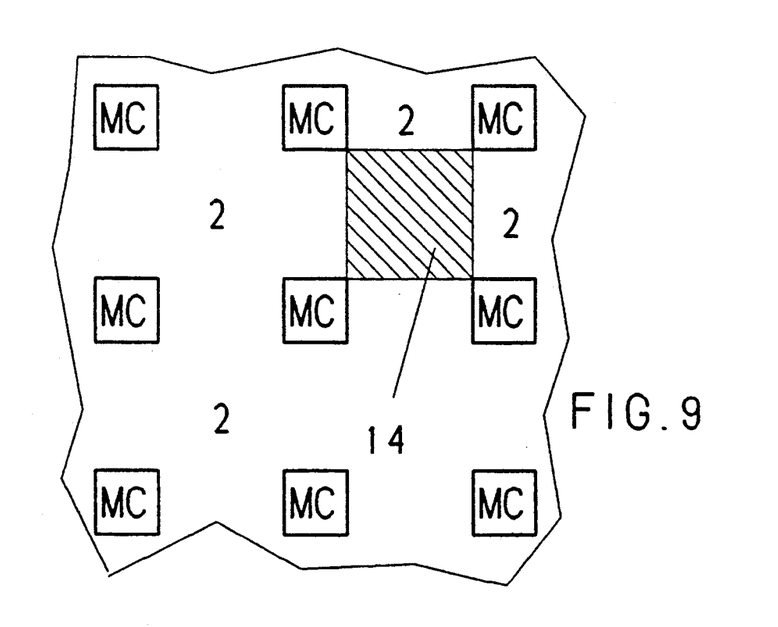
FIG. 9 shows arrangements of square MCT cells in accordance with the invention having gaps which are twice as large.

The first alternative solution of the invention (FIGS. 8A and B; FIG. 9) comprises individual square or strip-type MCT cells MC which are mutually separated by nonemitting gaps 2 having a corresponding intermediate area 14 between adjacent cells. In this connection, "nonemitting" is understood as meaning that no regions which are comparable to the emitter regions 9 of the MCT cells and which inject charge carriers into the base layer are present in the gaps 2. According to the invention, the lateral linear dimensions of the nonemitting gaps 2 (in the simplest case, the difference between cell spacing b and cell width a) are at least of the same order of magnitude as the corresponding dimensions of the individual MCT cell MC (cell width a). In that case, the intermediate area 14 is at least equally as large as the area which the MCT cells MC require. In the example of FIGS. 8A and B, the linear dimensions of cell and gap are, in particular, equal. In the example of FIG. 9, the linear dimensions of the gaps 2 are twice as large as the linear dimensions of the cells. In this case, the square intermediate area 14 is consequently 4 times as large as the area of the individual MCT cell MC.

The gaps 2 and, consequently, the intermediate area 14 may, however, also be still larger if desired. For very large spacings between the MCT cells MC, however, only a very small amount of $n^+$-type emitter area (the emitter regions 9) is present on the cathode side so that in some cases considerably increased ON resistances are to be expected.

In a second alternative solution of the invention, use is therefore made of the result of the experiments previously described to the effect that closest-packed arrangements of only a few cells in matrix form (for example a (3×3) matrix), still scale linearly (see FIG. 5). In this connection, the concept of a "cluster" of MCT cells will first of all be introduced here. Cell cluster is understood as meaning a "small" number of closest-packed MCT cells. In this connection, "small" means more than 1, for example 1×2, 1×3, etc., 2×2, 2×3, 2×4 and, of course, also 3×3. The essential point is that the cell cluster is small enough for the scaling still to take place linearly or at least not to deviate substantially from linearity.

In accordance with the second alternative solution, instead of the individual MCT cells (FIG. 10A), the cell clusters 15 (FIG. 10B) defined above are separated by nonemitting gaps 2 whose lateral linear dimensions are at least of the same order of magnitude as the corresponding dimensions of the individual MCT cell MC. Preferably, in accordance with FIG. 7, the cell spacing b between cells in different clusters should be at least 60 μm.

Figure 10A:
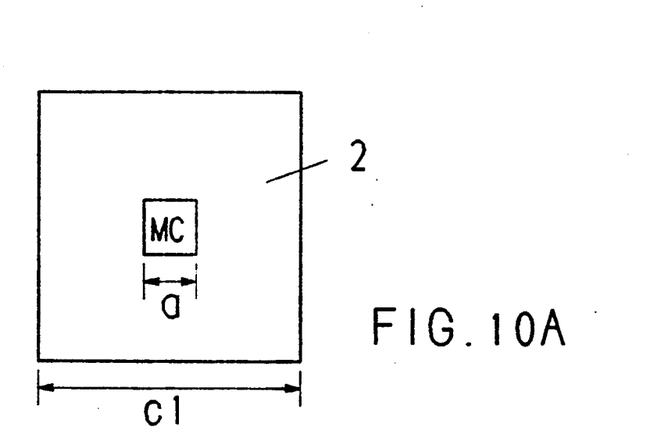
FIG. 10A shows an individual MCT cell with a surrounding gap in accordance with the first alternative achievement of the invention.
Figure 10B:
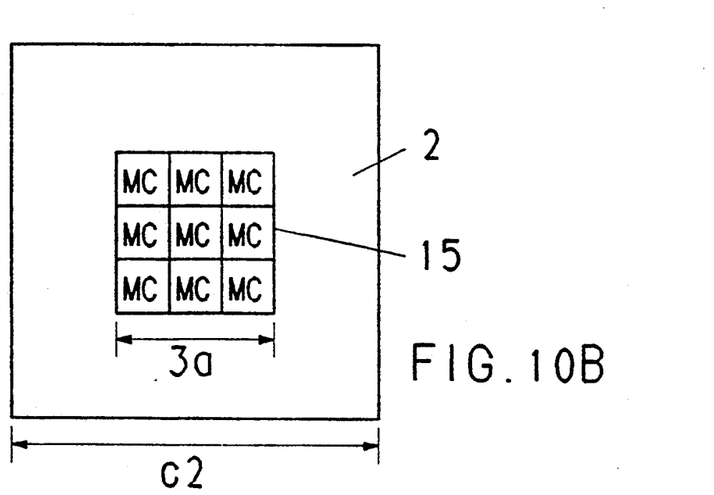
FIG. 10B shows a cell cluster of MCT cells having a surrounding gap in accordance with the second alternative achievement of the invention.

The comparison between FIGS. 10A and 10B makes the improved area utilization achieved with the cell clusters clear: in FIG. 10A, a square MCT cell MC having the cell width a (for example, 20 μm) is surrounded by a nonemitting square gap 2 having the edge length c1 (for example, 100 μm). The linear dimension of the gap 2 is in this case C1-a, that is to say 80 μm in accordance with the example. The area utilization factor is in this case $a^2/(c1)^2$, that is to say 1/25 or 0.04 in accordance with the example.

In FIG. 10B, a cell cluster 15 in the form of a (3×3) matrix having the cluster width 3a (=60 μm) is surrounded by a nonemitting gap 2 having the edge length c2 (=140 μm). The linear dimension of the gap 2 is in this case also 80 μm, the area utilization, on the other hand, is $(3a)^2/(c2)^2$, i.e. 3600/19,600 or 0.184. From this it becomes clear that a component in accordance with the second alternative solution has an appreciably improved ratio of emitting to passive cathode area.

Hitherto the gaps 2, which produce the spacing between the individual MCT cells and/or cell clusters, were only required not to contribute, for their part, to the electron emission from the cathode. However, the gaps 2 may, in addition, be used for other purposes which are not in harmony with the nonemission. Thus, in particular, the linear dimensions of the gaps 2 can be reduced without loss of performance if devices which bring about an additional extraction of holes during turn-off are provided in the gaps 2.

Figure 10C:
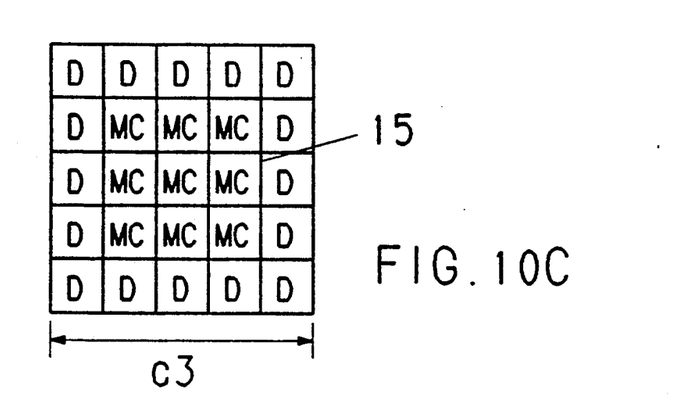
FIG. 10C shows a cell cluster which, in accordance with a preferred embodiment of the invention is surrounded by DMOS cells in the gap.
Figure 13:
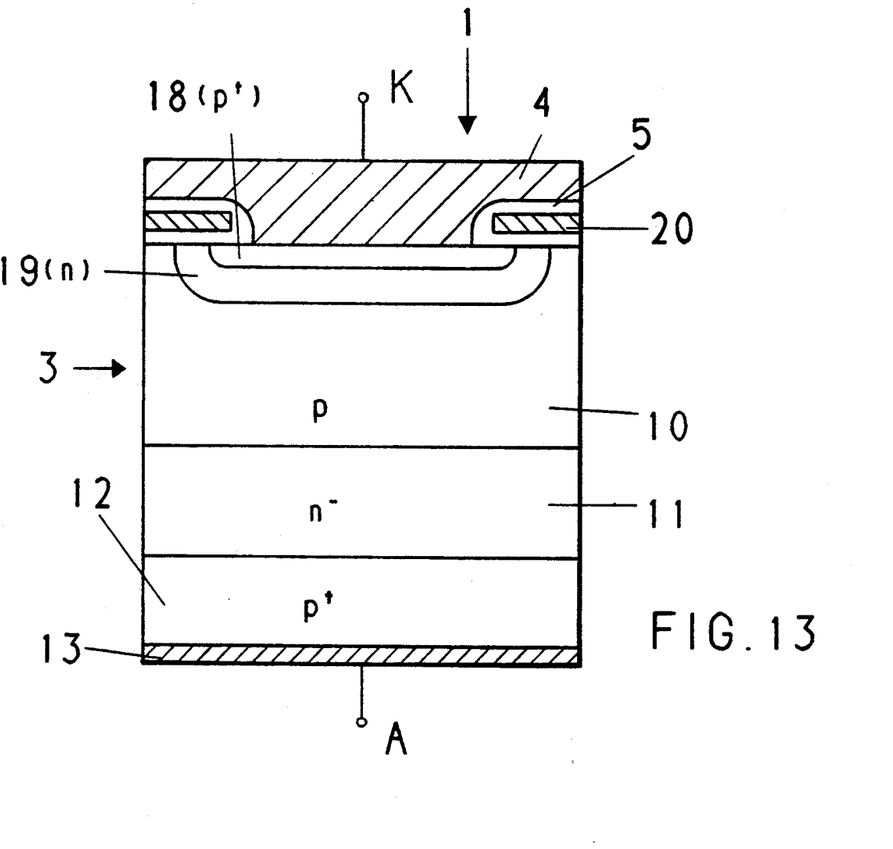
FIG. 13 shows the cross section through a DMOS cell in accordance with FIG. 10C.

Such devices are, in accordance with a preferred embodiment of the invention, so-called DMOS cells D (FIG. 10C) which surround the individual MCT cell or the cell cluster 15 and can be switched on by MOS control in order to extract holes. The internal structure of such a DMOS cell D is shown in FIG. 13. In addition to the parts already known from FIG. 1D, in this cell a continuous channel region 19 (n-doped) and a cathode short-circuit region 18 ($p^+$-doped) embedded in said channel region 19 which, together with second gate electrodes 20 disposed above the channel region 19, form an MOS-controlled short circuit between the second base layer 10 and the cathode short-circuit region are provided in this cell on the cathode side.

In the ON state of the component, the DMOS cells are inactive, i.e. the MOS-controlled short circuit is not turned on. The five-layer structure of the cell does not have any effect on the operation of the other components (the MCT cells). In particular, no emission takes place. During turn-off, however, the short circuit is turned on, with the result that holes can be extracted from the second base layer 10 in the direction of the cathode and the turn-off capability as a whole is improved. For the same performance and size of the cell cluster 15, such DMOS cells D make it possible to achieve an edge length c3 of the gaps which, at 100 μm, is markedly less than in the arrangement in accordance with FIG. 10B and, accordingly, results in a still better area utilization.

Figure 11A:
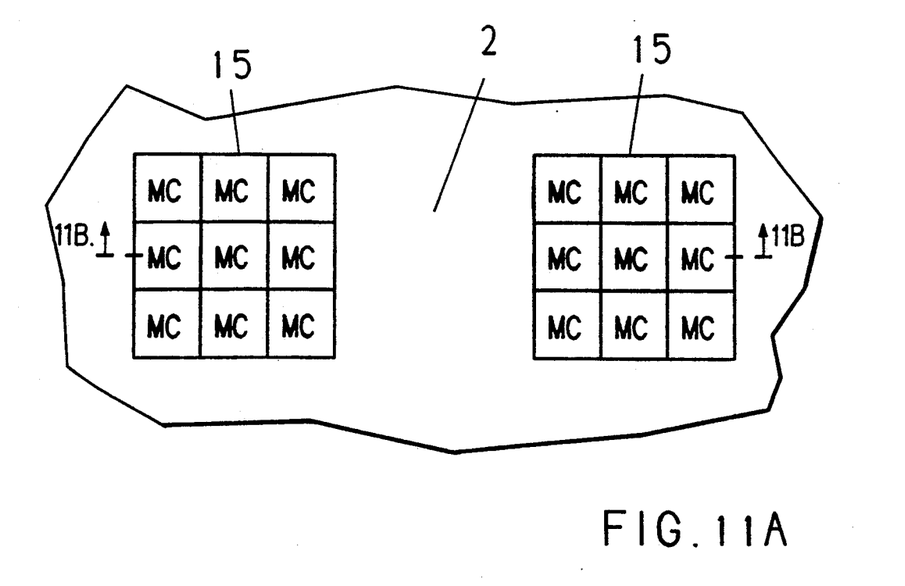
FIGS. 11A, B show a plan view of, and a cross section through, an arrangement containing cell clusters, which arrangement, in accordance with a further embodiment of the invention, is covered with a reinforced oxide layer in the gaps on the cathode side.
Figure 11B:
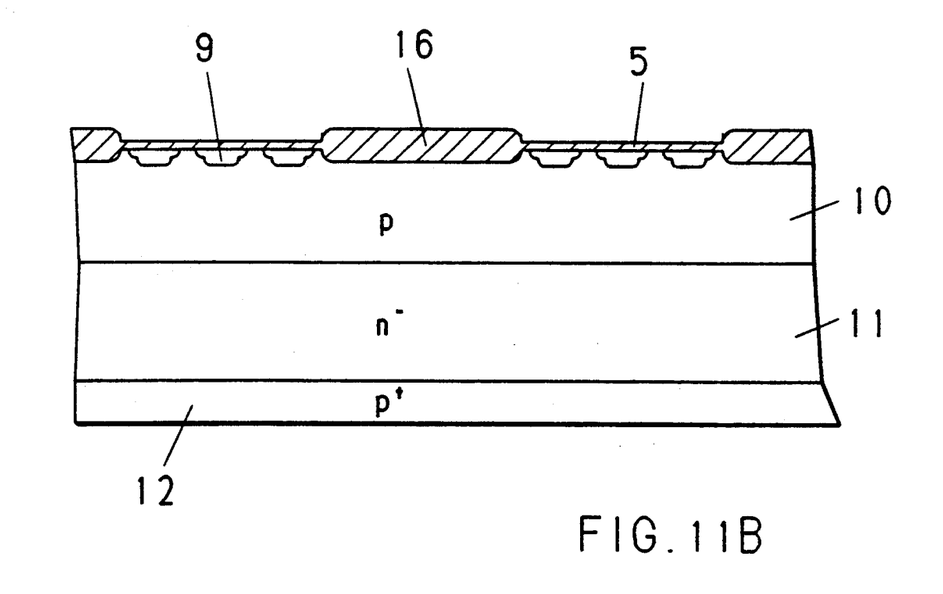

A further preferred embodiment of the invention can be explained by reference to FIGS. 11A and 11B. FIG. 11A shows in this case a plan view of the structuring, already described, of the cathode area with cell clusters 15 and gaps 2. FIG. 11B shows the internal structure along the cross-sectional line Y—Y from FIG. 11A, the details of the individual MCT cells (cathode connection, gate electrodes etc.) having been omitted for reasons of clarity.

For the purpose of explanation, reference is made yet again to FIGS. 10A and 10B. If the cathode is structured in the form shown therein (MCT cell or cell cluster surrounded by a nonemitting gap), it is not necessary to cover the entire area between the cells or clusters with a thin gate oxide (gate insulation 5) since MOS channels, which require the thin gate oxide, are only situated inside the MCT cells. It is therefore possible to provide a reinforced oxide layer 16 (FIG. 11B) over the gaps 2 on the cathode surface in order, in this way, to reduce the component input capacitance and, consequently, also the gate driver requirements quite substantially. One way of producing an oxide layer 16 over the gaps 2, which oxide layer 16 is reinforced in contrast to the thin gate insulation 5, is to use a LOCOS process, which is known per se.

Figure 12A:
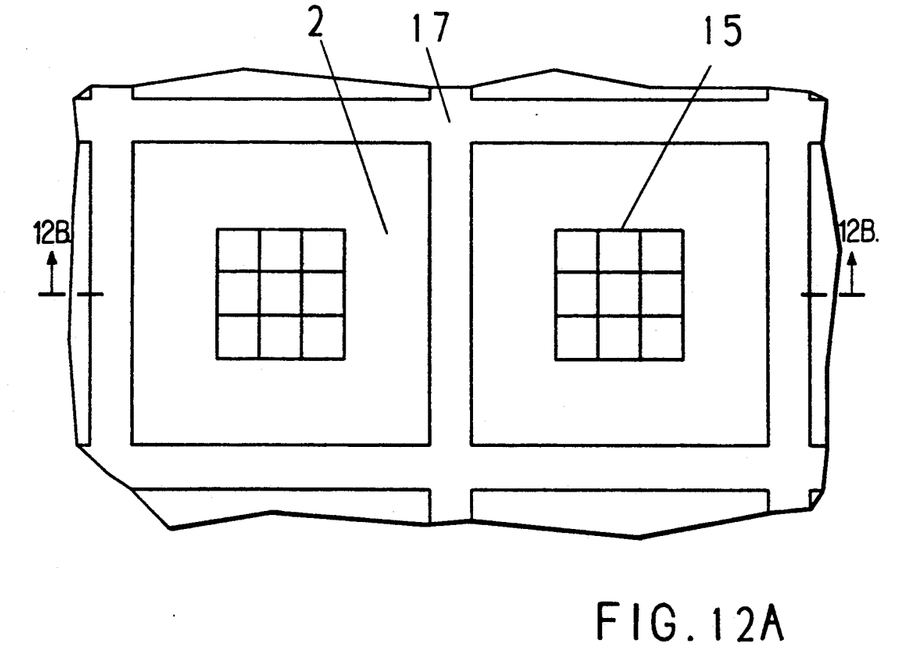
FIGS. 12A, B show a plan view of, and a cross section through, an arrangement containing cell clusters, which arrangement, in accordance with a further embodiment of the invention, has free-floating, heavily doped separation regions in the gaps.
Figure 12B:
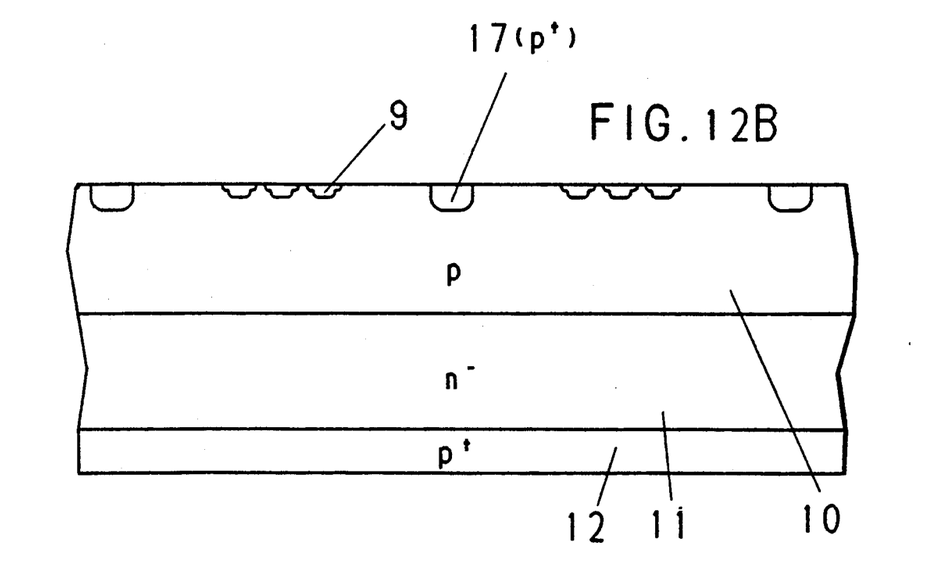

A further preferred embodiment may be explained by reference to FIGS. 12A and 12B, in which connection FIG. 12A shows a plan view of said embodiment, whereas FIG. 12B shows the cross section along the line Z—Z in FIG. 12A. In this embodiment, the gaps 2 between the cell clusters 15 (or, alternatively, the individual MCT cells) are additionally used in another way: unconnected, i.e. free-floating, heavily doped separation regions 17 ($p^+$-doped) are provided in the form of a grade or network inside the comparatively lightly doped second base layer 10, which emerges at the cathode surface in the gaps 2. This structure is shown in FIG. 12A for square clusters. Analogous configurations result for individual square cells in accordance with FIG. 8A or strip-type cells in accordance with FIG. 8B. It is obvious that reinforced oxide layers 16 in accordance with FIG. 11B can also be provided in this embodiment.

The advantage of the heavily doped, localized separation region 17 is as follows: if the formation of a current inhomogeneity or even of a current filament should occur in the component, an increase in the local potential between anode A and cathode K is also associated therewith. The occurrence of this potential difference compared with regions having average current density is impeded by the presence of the low-resistance separation region 17 so that extreme inhomogeneities are smoothed out.

All in all, therefore, the invention makes available an MCT in which the performance of the individual cell can be rendered usable to the full extent even over large areas and for large numbers of cells.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. An MOS-controlled thyristor MCT, comprising:
   (a) a semiconductor substrate having two opposite principal surfaces, one of which is assigned to an anode, and the other is assigned to a cathode and forms a cathode surface;
   (b) a layer sequence inside the semiconductor substrate between the anode and the cathode, which layer sequence comprises an emitter layer of a first conductivity type, a first base layer of a second conductivity type opposite to the first conductivity type, and a second base layer of the first conductivity type;
   (c) a multiplicity of adjacently disposed and parallel-connected MCT cells inside the semiconductor substrate between the anode and the cathode, the MCT cells having a cell width;
   (d) an emitter region of the second conductivity type embedded in the second base layer inside every MCT cell on the cathode side, connection to which emitter region is made from the cathode surface by means of cathode contact; and
   (e) an MOS structure, which forms a switchable short circuit between the second base layer and the cathode contact, inside every MCT cell on the cathode side, wherein
   (f) the individual MCT cells are mutually separated by nonemitting gaps which do not inject charge carriers into the second base layer; and
   (g) the lateral linear dimension of the nonemitting gaps are greater than or at least equal to the cell width.

2. The MOS-controlled thyristor MCT as claimed in claim 1, wherein the lateral linear dimensions of the nonemitting gaps are greater by a multiple than the cell width of the individual MCT cell.

3. An MOS-controlled thyristor MCT, comprising:
   (a) a semiconductor substrate having two opposite principal surfaces, one of which is assigned to an anode, and the other is assigned to a cathode and forms a cathode surface;
   (b) a layer sequence inside the semiconductor substrate between the anode and the cathode, which layer sequence comprises an emitter layer of a first conductivity type, a first base layer of a second conductivity type opposite to the first conductivity type, and a second base layer of the first conductivity type;
   (c) a multiplicity of adjacently disposed and parallel-connected MCT cells inside the semiconductor substrate between the anode and the cathode, the MCT cells having a cell width;
   (d) an emitter region of the second conductivity type embedded in the second base layer inside every MCT cell on the cathode side, connection to which emitter region is made from the cathode surface by means of cathode contact; and
   (e) an MOS structure, which forms a switchable short circuit between the second base layer and the cathode contact, inside every MCT cell on the cathode side, wherein
   (f) all the MCT cells are combined in a plurality of cell clusters;
   (g) every cell cluster is formed from a few MCT cells which are disposed in the immediate vicinity of one another;
   (h) the cell clusters are mutually separated by nonemitting gaps which do not inject charge carriers into the second base layer; and
   (i) the lateral linear dimensions of the nonemitting gaps are greater than or at least equal to the cell width.

4. The MOS-controlled thyristor as claimed in claim 3, wherein the lateral linear dimensions of the nonemitting gaps are larger by a multiple than the cell width the individual MCT cell.

5. The MOS-controlled thyristor MCT as claimed in any of claims 1-4, wherein a reinforced oxide layer is deposited in the gaps on the cathode surface.

6. The MOS-controlled thyristor MCT as claimed in any of claims 1-4, wherein a heavily doped, localized and free-floating separation region of the first conduction type is embedded in the second base layer from the cathode surface in the gaps, which separation region mutually separates the MCT cells or cell clusters.

7. The MOS-controlled thyristor MCT as claimed in any of claims 1-4, wherein
   (a) DMOS cells are disposed in the gaps;
   (b) inside every DMOS cell on the cathode side a channel region of the second conductivity type is embedded in the second base layer and a cathode short-circuit region of the first conductivity type is embedded in the channel region, and connection is made to the cathode short-circuit region from the cathode surface by means of the cathode contact; and
   (c) an MOS structure is provided inside every DMOS cell on the cathode side, which MOS structure forms a switchable short circuit between the second base layer and the cathode short-circuit region.

8. The MOS-controlled thyristor MCT as claimed in any of claims 1-4, wherein
   (a) the emitter layer is $p^+$-doped, the first base layer is $n^-$-doped, the second base layer is p-doped and the emitter region is $n^+$-doped; and
   (b) the MOS structure is a p-channel MOSFET.

9. The MOS-controlled thyristor MCT as claimed in any of claims 1-4, wherein
   (a) a reinforced oxide layer is deposited in the gaps on the cathode surface; and
   (b) a heavily doped, localized and free-floating separation region of the first conduction type is embedded in the second base layer from the cathode surface in the gaps, which separation region mutually separates the MCT cells or cell cluster.

10. The MOS-controlled thyristor MCT as claimed in any of claims 1-4, wherein:
    (a) the remitter layer is $p^+$-doped, the first base layer is $n^-$-doped, the second base layer is p-doped and the emitter region is $n^+$-doped; and
    (b) the MOST structure is a p-channel MOSFET.

11. The MOS-controlled thyristor as claimed in any of claims 1-4, wherein:
    (a) a reinforced oxide layer is deposited in the gaps on the cathode surface;
    (b) the emitter layer is $p^+$-doped, the first base layer is $n^-$-doped, the second base layer is p-doped and the emitter region is $n+$-doped; and
    (c) the MOS structure is a p-channel MOSFET.

12. The MOS-controlled thyristor as claimed in any of claims 1-4, wherein:
    (a) a heavily doped, localized and free-floating separation region of the first conduction type is embedded in the second base layer from the cathode surface in the gaps, which separation region mutually separates the MCT cells or cell clusters;
    (b) the emitter layer is $p^+$-doped, the first base layer is $n^-$-doped, the second base layer is p-doped and the emitter region is $n+$-doped; and
    (c) the MOS structure is a p-channel MOSFET.

13. The MOS-controlled thyristor MCT as claimed in any of claims 1-4, wherein:
    (a) a reinforced oxide layer is deposited in the gaps on the cathode surface;
    (b) a heavily doped, localized and free-floating separation region of the first conduction type is embedded in the second base layer from the cathode surface in the gaps, which separation region mutually separates the MCT cells or cell clusters;
    (c) the emitter layer is $p^+$-doped, the first base layer is $n^-$-doped, the second base layer is p-doped and the emitter region is $n+$-doped; and
    (d) the MOS structure is a p-channel MOSFET.

14. The MOS-controlled thyristor as claimed in any of claims 1-4, wherein:
    (a) DMOS cells are disposed in the gaps;
    (b) inside every DMOS cell on the cathode side a channel region of the second conductivity type is embedded in the second base layer and a cathode short-circuit region of the first conductivity type is embedded in the channel region, and connection is made to the cathode short-circuit region from the cathode surface by means of the cathode contact;
    (c) an MOS structure is provided inset every DMOS cell on the cathode side, which MOS structure forms a switchable short circuit between the second base layer and the cathode short-circuit region;
    (d) the emitter layer is $p^+$-doped, the first base layer is $n^-$-doped, the second base layer is p-doped and the emitter region is $n+$-doped; and
    (e) the MOS structure is a p-channel MOSFET.

* * * * *